US007079226B2

(12) United States Patent
Vreugdewater et al.

(10) Patent No.: US 7,079,226 B2
(45) Date of Patent: Jul. 18, 2006

(54) LITHOGRAPHIC ACTUATOR MECHANISM, LITHOGRAPHIC APPARATUS, AND DEVICE MANUFACTURING METHOD

(75) Inventors: Patricia Vreugdewater, Eindhoven (NL); Sven Antoin Johan Hol, Eindhoven (NL); Henrikus Herman Marie Cox, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 17 days.

(21) Appl. No.: 10/797,568

(22) Filed: Mar. 11, 2004

(65) Prior Publication Data

US 2004/0218166 A1 Nov. 4, 2004

(30) Foreign Application Priority Data

Mar. 11, 2003 (EP) .................................. 03251456

(51) Int. Cl.
*G03B 27/58* (2006.01)
*G03B 27/62* (2006.01)

(52) U.S. Cl. ......................................... 355/72; 355/75
(58) Field of Classification Search .................. 355/53, 355/72, 75, 77; 310/12, 13, 27
See application file for complete search history.

(56) References Cited

U.S. PATENT DOCUMENTS

| 5,229,872 | A |   | 7/1993  | Mumola |       |
|-----------|---|---|---------|--------|-------|
| 5,296,891 | A |   | 3/1994  | Vogt et al. | |
| 5,523,193 | A |   | 6/1996  | Nelson | |
| 5,808,381 | A | * | 9/1998  | Aoyama et al. | 310/12 |
| 5,969,441 | A |   | 10/1999 | Loopstra et al. | |
| 6,005,310 | A |   | 12/1999 | Mosciatti et al. | |
| 6,184,596 | B1 |  | 2/2001  | Ohzeki | |
| 2002/0096946 | A1 | | 7/2002  | Bisschops | |
| 2003/0141769 | A1 | * | 7/2003 | Kubo | 310/12 |
| 2004/0032170 | A1 | * | 2/2004 | Tamai et al. | 310/13 |

FOREIGN PATENT DOCUMENTS

| WO | WO 98/33096 | 7/1998 |
| WO | WO 98/38597 | 9/1998 |
| WO | WO 98/40791 | 9/1998 |

OTHER PUBLICATIONS

European Search Report in reference to EP 03 25 1456, dated Feb. 10, 2004.

* cited by examiner

*Primary Examiner*—Peter B. Kim
(74) *Attorney, Agent, or Firm*—Pillsbury Winthrop Shaw Pittman LLP

(57) ABSTRACT

The present invention relates to a Lorentz actuator in the context of a lithographic projection apparatus. The present invention improves the thermal performance of a Lorentz actuator over the prior art by employing a plurality of coils, separated by separation layers of high thermal conductivity material in good thermal contact with a cooling element. In this way, heat flows more quickly from hotspot regions near the center of the coils into the cooling element. According to an embodiment of the invention, the cooling element is arranged to be in line with the separation layers so as to optimize the thermal connection between these two members. It is found that splitting a parent coil into two coils provides a practical balance between improved thermal performance and undesirable increases in volume and complexity.

19 Claims, 4 Drawing Sheets

LITHOGRAPHIC ACTUATOR MECHANISM, LITHOGRAPHIC APPARATUS, AND DEVICE MANUFACTURING METHOD

BACKGROUND OF THE INVENTION

1. Priority Information

This application claims priority from European Patent Application No. 03251456.4, filed Mar. 11, 2003, herein incorporated by reference in its entirety.

2. Field of the Invention

The present invention relates to a lithographic apparatus, and in particular, to a lithographic actuator mechanism and an associated device manufacturing method.

3. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

- a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;
- a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the said non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and
- a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth here above.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features.

This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus maybe of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

A lithographic apparatus of the type described above employ a plurality of actuators for positioning a part or component of the apparatus. Such actuators are applied for positioning a substrate table, a part of an irradiation system, a part of an illumination system or any other part of the lithographic apparatus.

A commonly used actuator is the Lorentz actuator. In such a device, an actuating force is derived from the magnetic field associated with a current driven through a suitably arranged coil. It is generally desirable that actuators of this type are as compact and powerful as possible.

SUMMARY OF THE INVENTION

As discussed above, to increase the power and/or increase the size of a Lorentz actuator, it is necessary to increase the current density in the coils. However, increased current density leads to increased heat dissipation which is undesirable as high operating temperatures reduce component lifetimes and may disturb adjacent heat sensitive components. Moreover, known designs of Lorentz actuator are cooled by cooling plates, through which water is circulated, attached to the coils. But simply increasing the flow of coolant still leaves undesirable variations in temperature in the body of the coil.

For these and other reasons, the principles of the present invention, as embodied and broadly described herein, provide for a lithographic Lorentz actuator having improved thermal behavior. In one embodiment, a lithographic projection apparatus is presented, comprising a radiation system for providing a projection beam of radiation, a support structure for supporting a patterning device that configures the projection beam according to a desired pattern, a substrate holder for holding a substrate, projection system for projecting the patterned beam onto a target portion of the substrate, and an actuator mechanism a coil arrangement in thermal contact with at least one cooling element, wherein the coil arrangement includes a plurality of coils separated from each other by one or more separation layers of high thermal conductivity material arranged to be in substantial thermal contact with the cooling element.

By employing a plurality of coils rather than a single coil, the average coil cross-section is reduced. The hotspot temperature depends on the rate at which heat is conducted away from the coils into the separation layers and cooling element. Splitting a parent coil into smaller coils has the effect of increasing the area of contact, and reducing the spatial separation, between the coils and the separation layers/cooling element. The result is a more efficient thermal connection that conducts heat more rapidly away from the coils, thus helping to reduce hotspot temperatures.

In one embodiment of the present invention, a lithographic projection apparatus is provided wherein the separation layers are parallel to the plane of the coil arrangement and wherein the cooling element is located radially outward therefrom.

In another embodiment, a lithographic projection apparatus is provided, wherein the separation layers of high thermal conductivity material are perpendicular to the plane of said coil arrangement and wherein the cooling element is located axially above or axially below said coil arrangement.

In a still another embodiment, a lithographic projection apparatus is provided, wherein the separation layers comprise first layers that are parallel to the plane of the coil arrangement and second layers that are perpendicular to the plane of the coil arrangement and wherein the cooling element comprises first elements located radially outward from the coil arrangement and second elements located axially above or below said coil arrangement.

In a still further embodiment of the present invention, the cooling element is a plate, in which is formed cooling channels, a coolant fluid being circulated through the cooling channels. The cooling channels may have a substantially circular or a substantially rectangular cross-section.

In yet a further embodiment of the present invention, said separation layers are provided with cooling channels, a coolant fluid being circulated through said cooling channels. The cooling channels may have a substantially circular or substantially rectangular cross-section.

The above embodiments ensure the shortest, and therefore lowest thermal resistance, path between the separation layers and the cooling element. This feature helps ensure that heat is conducted efficiently away from the coils by ensuring that the separation layers are kept at the lowest temperature possible.

Although the thermal behaviour of a Lorentz actuator is improved through the use of multiple coils, there are practical limits that govern the best number to choose. Firstly, the separation layers inserted between individual coils undesirably increase the volume of the coil arrangement. Secondly, the complexity of the required electrical connections increases with the number of coils, as does the cost of manufacture. It is found that for many purposes an optimal balance is achieved with two coils.

According to another embodiment of the invention there is provided a device manufacturing method comprising providing a substrate held by a substrate holder, providing a beam of radiation using an illumination system, imparting a desired pattern onto the beam of radiation by a patterning device supported by a support structure, projecting the patterned beam of radiation onto a target portion of the substrate via a projection system; and positioning at least a part of one of the radiation system, the support structure, the substrate holder, and the projection system by an actuator mechanism. The actuator mechanism comprises a coil arrangement that includes a plurality of coils separated from each other by one or more separation layers of high thermal conductivity material arranged to be in substantial thermal contact with at least one cooling element.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF DRAWINGS

Embodiments of the invention will now be described, by way of example only, with reference to the accompanying schematic drawings in which.

In the Figures, corresponding reference symbols indicate corresponding parts.

DETAILED DESCRIPTION OF THE INVENTION

Lithographic Apparatus

Figure 1:
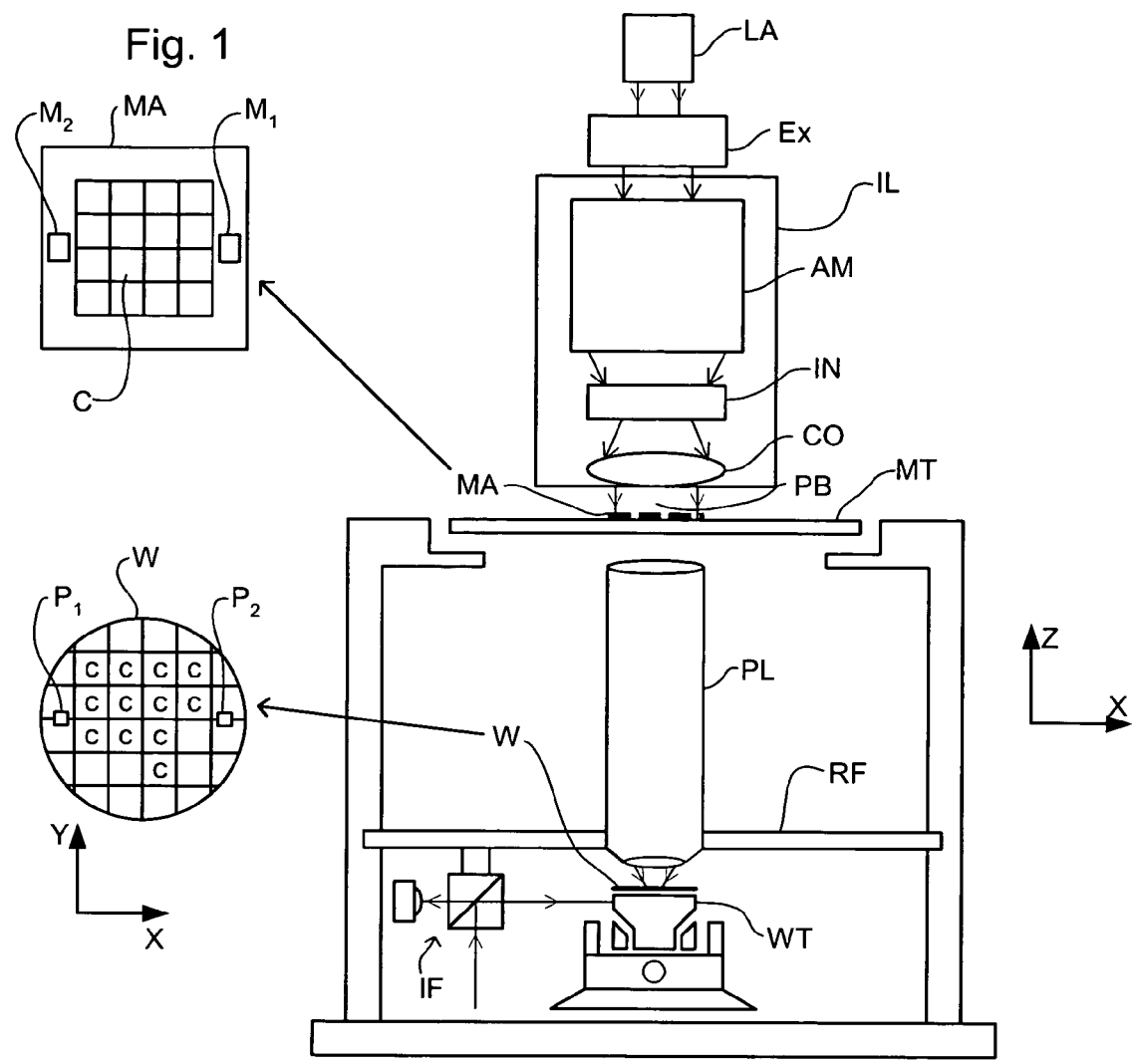
FIG. 1 depicts a lithographic projection apparatus according to an embodiment of the invention.

FIG. 1 schematically depicts a lithographic apparatus according to a particular embodiment of the invention. The apparatus comprises:

- a radiation system Ex, IL: for supplying a projection beam PB of radiation (e.g. UV radiation). In this particular case, the radiation system also comprises a radiation source LA;
- a first object table (mask table) MT: provided with a mask holder for holding a mask MA (e.g. a reticle), and connected to first positioning mechanism PM for accurately positioning the mask with respect to item PL;
- a second object table (substrate table) WT: provided with a substrate holder for holding a substrate W (e.g. a resist-coated silicon wafer), and connected to second positioning mechanism PW for accurately positioning the substrate with respect to item PL; and
- a projection system ("lens") PL: for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a mercury lamp or an excimer laser) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in a variety of different modes:

- step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure;
- scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion; and
- other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments

As noted above, lithographic apparatus employ actuating mechanisms for positioning a part or component of the apparatus. Such actuators are applied for positioning a substrate table, a part of an irradiation system, a part of an illumination system or any other part of the lithographic apparatus.

Figure 2:
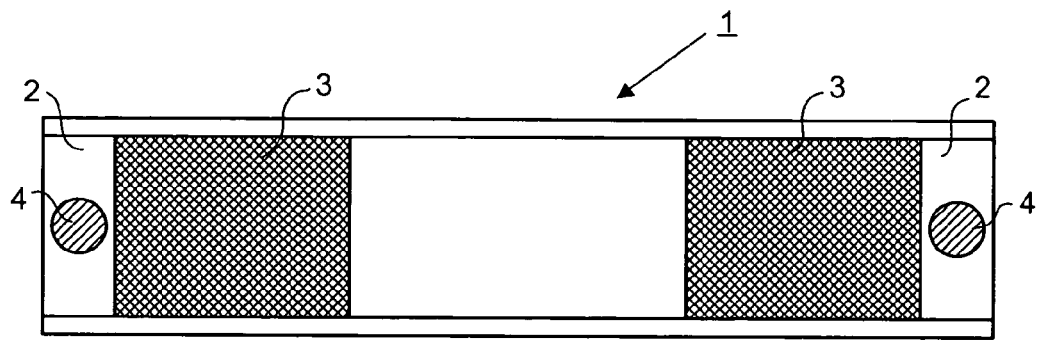
FIG. 2 depicts the coil arrangement of a Lorentz actuator according to the prior art.
Figure 3:
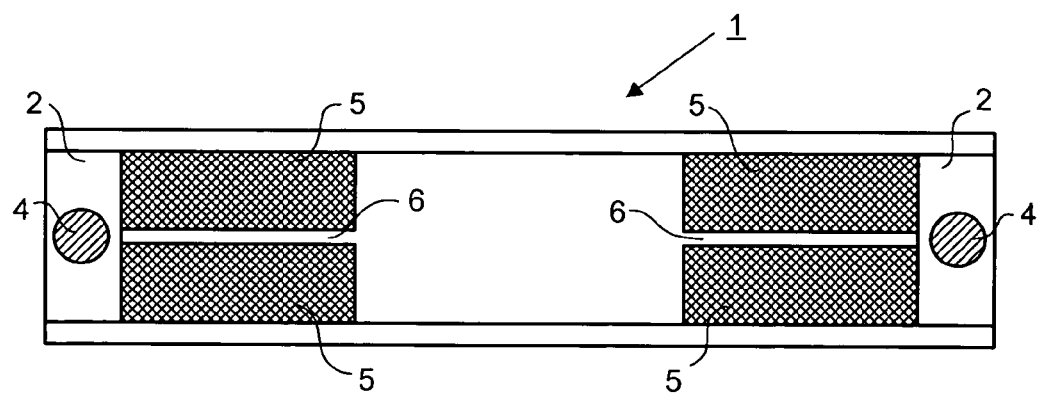
FIG. 3 depicts a coil arrangement of a Lorentz actuator according to a preferred embodiment of the present invention.
Figure 4:
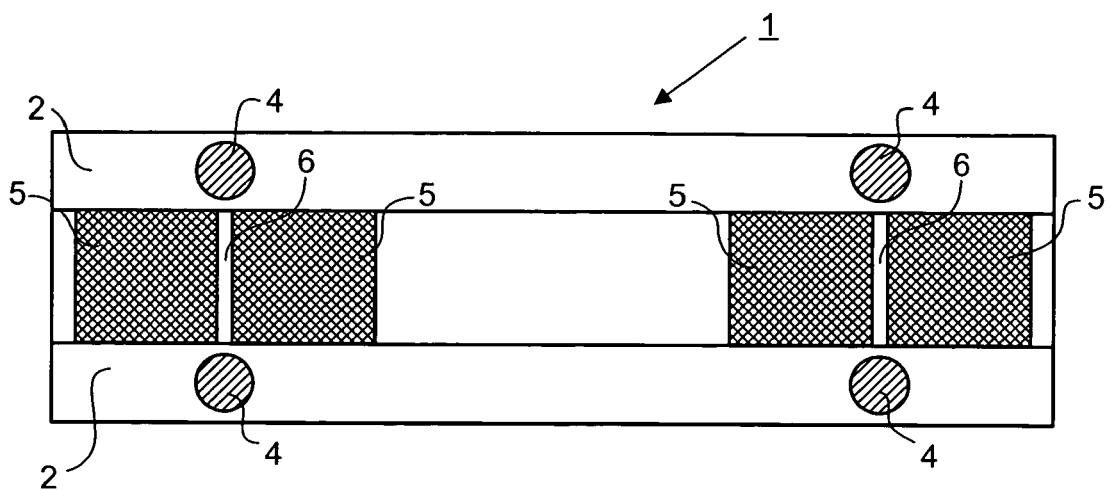
FIG. 4 depicts a coil arrangement of a Lorentz actuator according to a further preferred embodiment of the present invention.

Generally, a Lorentz actuator comprises a magnet assembly and an electrically conductive element, such as a coil arrangement. A Lorentz actuator relies on resultant magnetic fields generated by the magnet assembly to apply the actuating force, which is typically produced by driving a current through the coil arrangement. Each of FIGS. 2, 3 and 4 are cross-sectional views of coil arrangements 1 for a Lorentz actuator, cut by a vertical plane passing through a diameter of the coil(s). Heat is inevitably generated due to the finite electrical resistance of the coils 3,5 and needs to be conducted efficiently away if the coils 3,5 are not to overheat.

FIG. 2 represents a prior art coil arrangement 1. Here, a single coil 3 is provided in contact with a cooling element of high thermal conductivity. For a vertical magnetic field, a current flow in the coil 3 is directed into the page on the right of the figure and out of the page on the left of the figure. As the temperature of the coil 3 rises, heat flows out of the coil 3 into the cooling element. The cooling element, which is in this example, comprises a cooling element plate 2, is cooled in turn by a network of cooling channels 4, running through the cooling element plate 2, within which a coolant, such as water, is circulated. The problem with this arrangement is that there is a relatively poor thermal contact between the center of the coil 3 and the cooling element, leading to hotspots that can damage the coil arrangement 1 over time or thermally disturb adjacent heat sensitive components.

According to one embodiment of the present invention, which is illustrated in FIGS. 3 and 4, the situation can be greatly improved by splitting the parent coil into a number of smaller coils 5 each separated by a separation layer 6 of high thermal conductivity material, arranged to be in good thermal contact with at least one cooling element. The close proximity of the separation layer 6 to the center of each hotspot provides both a low thermal resistance pathway to the cooling element and a high temperature gradient, both of which encourage a rapid flow of heat away from the coils 5.

According to another embodiment of the present invention, it is possible to improve the thermal contact between the separation layers 6 and the cooling element by locating them in direct line with each other. When adopting a configuration such as that depicted in FIG. 3, wherein two identical coils 5 are located adjacent to each other with a separation layer 6 oriented radially, it is best to locate the cooling element radially outwards from the coils 5 in line with the separation layer 6 as shown.

Alternatively, when adopting a configuration such as that depicted in FIG. 4, wherein coplanar coils 3 of differing radii are located one within the other with a separation layer 6 oriented perpendicularly to the plane of the coils 5, it is more effective to locate the cooling channel above or below the coils 5 in line with the separation layer 6 as shown.

For each of the above two configurations, it is possible to vary the number of cooling channels 4 within the cooling plates 2. A larger number of cooling channels 2 will normally provide greater cooling. In any case, the cooling channels 4 normally represent the coolest portions of the cooling element and are therefore best located to be as much as possible in line with the separation layers 6. The cooling channels 4 may be substantially circular or substantially rectangular in cross-section, each having certain advantages with regard to ease of manufacture and arrangement. When adopting a combination of the above two configurations, a more complex arrangement of both cooling channels 4 and cooling element may be desirable in order to position each to be as much as possible in line with the separation layers 6.

Figure 5:
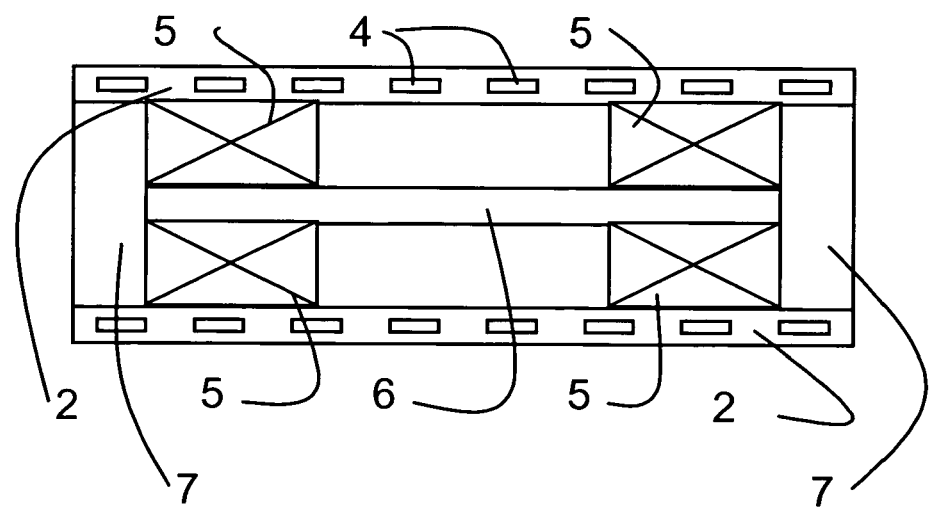
FIG. 5 depicts a coil arrangement of a Lorentz actuator according to a preferred embodiment of the present invention comprising two cooling plates.

An alternative arrangement is shown in FIG. 5 comprising a coil arrangement of two coils 5 enclosed by two cooling plates 2 provides with cooling channels 4. In between the two coils a separation layer 6 is provided. Thermal contact between the cooling plates and the separation layer is provided by the elements 7 that are made of a material with a high thermal conductivity. It should be noted that those elements may also be provided with cooling channels.

Figure 6:
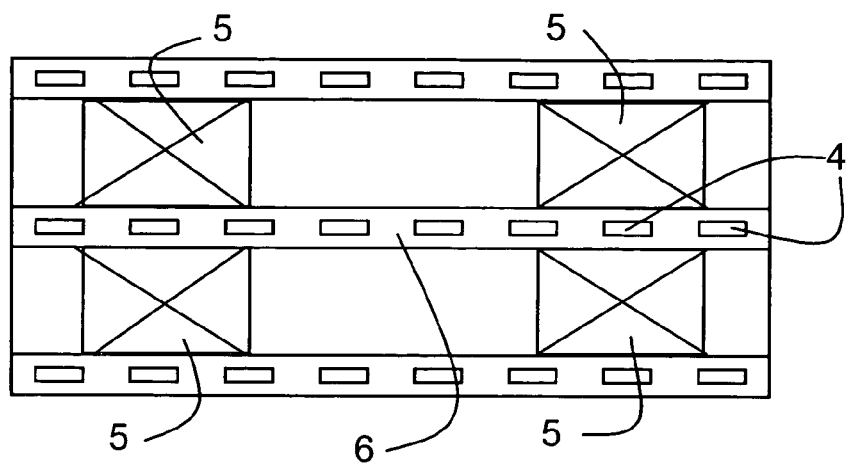
FIG. 6 depicts a coil arrangement of a Lorentz actuator according to the present invention wherein the separation layer also comprises cooling channels.
Figure 7:
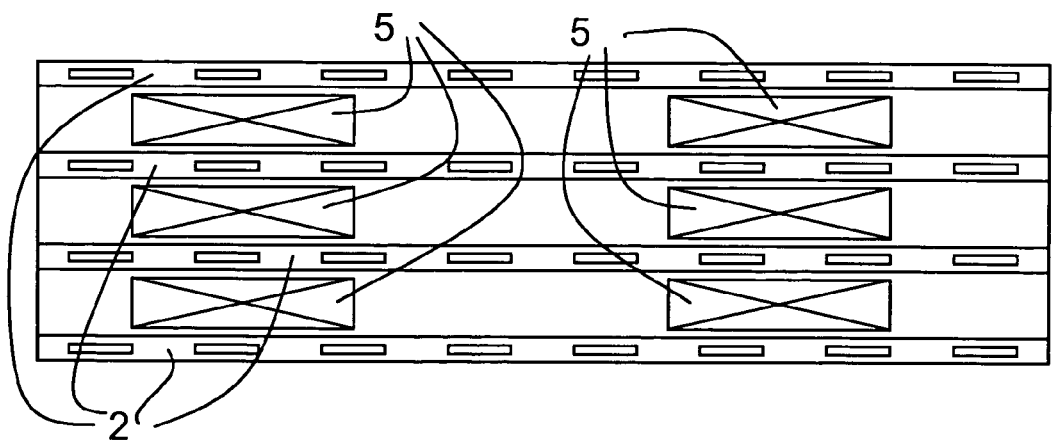
FIG. 7 depicts a coil arrangement of a Lorentz actuator according to the present invention comprising three coils separated by four cooling plates.

In a further embodiment, the separation layer 6 is also provided with cooling channels 4, as shown in FIG. 6. The coil arrangement shown comprises two coils 5 enclosed by two cooling plates, similar to FIG. 5. In such an arrangement, it may not be necessary to connect the cooling plates on the outside of the coil assembly with the inner separation layer provided with the cooling channels. The arrangement shown in FIG. 6 can further be expanded to coil arrangements wherein the number of coils is larger than 2. FIG. 7 shows a coil arrangement comprising 4 cooling plates 2 enclosing three coils 5. The number of separation layers (or cooling plates) may be determined by the thermal requirements of the application, i.e. the amount of dissipation in the coils and the maximum allowable temperature of the coils.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
    a radiation system configured to provide a beam of radiation;
    a support structure configured to support a patterning device is, said patterning configured to impart a pattern to said beam of radiation;
    a substrate holder configured to hold a substrate;
    a projection system that projects said patterned beam onto a target portion of said substrate; and
    an actuator configured to position at least one part within said radiation system, said support structure, said substrate holder, or said projection system, said actuator comprising a coil arrangement that includes a plurality of coils separated train each other by one or more separation layers of high thermal conductivity material arranged to be in substantial thermal contact with at least one cooling element that circulates coolant fluid and is distinct from said one or more separation layers.

2. A lithographic apparatus according to claim 1, wherein said separation layers are parallel to the plane of said coil arrangement and wherein said cooling element is located radially outward from said coil arrangement.

3. A lithographic apparatus according to claim 1, wherein said separation layers are perpendicular to the plane of said coil arrangement and wherein said cooling element is located axially above and/or axially below said coil arrangement.

4. A lithographic apparatus according to claim 1, wherein said separation layers comprise first layers that are parallel to the plane of said coil arrangement and second layers that are perpendicular to the plane of said coil arrangement and wherein said cooling element elements located axially above or below said coil arrangement.

5. A lithographic apparatus according to claim 1, wherein at least one of said cooling element and separation layers are formed of steel.

6. A lithographic apparatus according to claim 1, wherein at least one of said cooling element and said separation layers are formed of ceramic.

7. A lithographic apparatus according to claim 1, wherein said cooling element is a plate containing cooling channels such that the coolant fluid can be circulated through said cooling channels.

8. A lithographic apparatus according to claim 7, wherein said cooling channels have a substantially circular or a substantially rectangular cross-section.

9. A lithographic apparatus according to claim 1, wherein said separation layers contain cooling channels such that the coolant fluid can be circulated through said cooling channels.

10. A device manufacturing method comprising:
providing a substrate held by a substrate holder;
providing a beam of radiation using an illumination system;
imparting a desired pattern onto said beam of radiation by a patterning device supported by a support structure;
projecting said patterned beam of radiation onto a target portion of said substrate via a projection system; and
positioning at least one part within said radiation system, said support structure, said substrate holder, or said projection system by an actuator, said actuator comprising a coil arrangement that includes a plurality of coils separated from each other by one or more separation layers of high thermal conductivity material arranged to be in substantial thermal contact with at least one cooling element that circulates coolant fluid and is distinct from said one or more separation layers.

11. A lithographic actuating mechanism, comprising:
a magnet assembly;
at least one cooling element; and
a coil arrangement including a plurality of coils separated from each other by one or more separation layers of high thermal conductivity material arranged to be in substantial thermal contact with said at least one cooling element that circulates coolant fluid and is distinct from said one or more separation layers.

12. A lithographic actuating mechanism according to claim 11, wherein said separation layers are parallel to the plane of said coil arrangement and wherein said cooling element is located radially outward from said coil arrangement.

13. A lithographic actuating mechanism according to claim 11, wherein said separation layers are perpendicular to the plane of said coil arrangement and wherein said cooling element is located axially above and/or axially below said coil arrangement.

14. A lithographic actuating mechanism according to claim 11, wherein said separation layers comprise first layers that are parallel to the plane of said coil arrangement and second layers that are perpendicular to the plane of said coil arrangement and wherein said cooling element comprises elements located axially above or below said coil arrangement.

15. A lithographic actuating mechanism according to claim 11, wherein at least one of said cooling element and separation layers are formed of steel.

16. A lithographic actuating mechanism according to claim 11, wherein at least one of said cooling element and said separation layers are formed of ceramic.

17. A lithographic actuating mechanism according to claim 11, wherein said cooling element is a plate containing cooling channels such that the coolant fluid can be circulated through said cooling channels.

18. A lithographic actuating mechanism according to claim 17, wherein said cooling channels have a substantially circular or a substantially rectangular cross-section.

19. A lithographic actuating mechanism according to claim 11, wherein said separation layers contain cooling channels such that the coolant fluid can be circulated through said cooling channels.

* * * * *